US011317486B2

(12) United States Patent
Zarcone et al.

(10) Patent No.: US 11,317,486 B2
(45) Date of Patent: Apr. 26, 2022

(54) COLOR CORRECTION LIGHTING CONTROL

(71) Applicant: APOGEE LIGHTING HOLDINGS, LLC, Deer Park, NY (US)

(72) Inventors: Frank Zarcone, Smithtown, NY (US); Karl Edward Keppeler, Manorville, NY (US); John Thomas Boccio, Miller Place, NY (US); Michael Boyd, Sayville, NY (US)

(73) Assignee: APOGEE LIGHTING HOLDINGS, LLC, Deer Park, NY (US)

( * ) Notice: Subject to any disclaimer, the term of this patent is extended or adjusted under 35 U.S.C. 154(b) by 46 days.

(21) Appl. No.: 16/823,984

(22) Filed: Mar. 19, 2020

(65) Prior Publication Data
US 2021/0298143 A1   Sep. 23, 2021

(51) Int. Cl.
*H05B 45/22* (2020.01)
*H05B 45/325* (2020.01)
*H03K 7/08* (2006.01)
*H05B 47/11* (2020.01)
*H05B 47/155* (2020.01)

(52) U.S. Cl.
CPC .............. *H05B 45/22* (2020.01); *H03K 7/08* (2013.01); *H05B 45/325* (2020.01); *H05B 47/11* (2020.01); *H05B 47/155* (2020.01)

(58) Field of Classification Search
CPC ...... H05B 45/20; H05B 45/22; H05B 45/325; H05B 47/10; H05B 47/11; H03K 7/08
See application file for complete search history.

(56) References Cited

U.S. PATENT DOCUMENTS

| 6,552,495 | B1 | 4/2003 | Chang | |
|---|---|---|---|---|
| 2009/0026976 | A1* | 1/2009 | Pohler | H05B 45/20 315/294 |
| 2011/0069960 | A1* | 3/2011 | Knapp | H04L 12/437 398/103 |
| 2012/0032969 | A1* | 2/2012 | Sugiyama | G06F 3/1431 345/589 |
| 2012/0081010 | A1* | 4/2012 | Hatley | H05B 45/20 315/149 |
| 2014/0028697 | A1* | 1/2014 | Kurtz | G01J 3/465 345/589 |

(Continued)

OTHER PUBLICATIONS

Schaar, R., "Designing the VEML6040 RGBW Color Sensor Into Applications" Vishy Semiconductors (Apr. 2018) pp. 1-17, Document No. 84331.

(Continued)

*Primary Examiner* — Abdullah A Riyami
*Assistant Examiner* — Syed M Kaiser
(74) *Attorney, Agent, or Firm* — Tutunjian & Bitetto, P.C.

(57) ABSTRACT

A color correction device includes a computation engine including a processor and a memory coupled to the processor. The computation engine is configured to receive reference color data. A software application stored in the memory and configured to compute adjustment values needed to achieve the reference color data from a target color. An output configured to output color corrected signals to light emitting diodes (LEDs) to achieve a reference color associated with the reference color data from the target color of the LEDs.

21 Claims, 13 Drawing Sheets

(56) References Cited

U.S. PATENT DOCUMENTS

| | | | | |
|---|---|---|---|---|
| 2014/0028698 A1* | 1/2014 | Maier | ................... | G09G 5/02 |
| | | | | 345/589 |
| 2014/0028699 A1* | 1/2014 | Kurtz | ................... | G01J 3/465 |
| | | | | 345/590 |
| 2018/0286297 A1* | 10/2018 | Ong | ................... | G09G 3/3406 |
| 2019/0320515 A1* | 10/2019 | Sadwick | ............... | H05B 47/16 |
| 2020/0043201 A1* | 2/2020 | Tanaka | ................ | G06T 19/006 |

OTHER PUBLICATIONS

LED "Avoiding Brightness and Color Mismatch with Proper RGB Gamut Calibration" The Global Information Hub for Lighting Technologies (Dec. 2017) pp. 1-12.

\* cited by examiner

COLOR CORRECTION LIGHTING CONTROL

BACKGROUND

The present invention generally relates to color correction circuits and lighting devices, and more particularly to devices for controlling color lighting effects in an environment.

Multiple strings of light emitting diodes (LEDs) are difficult to balance in terms of power, brightness, temperature and color.

SUMMARY

In accordance with an embodiment of the present invention, a color correction device includes a computation engine including a processor and a memory coupled to the processor. The computation engine is configured to receive reference color data. A software application stored in the memory and configured to compute adjustment values needed to achieve the reference color data from a target color. An output configured to output color corrected signals to light emitting diodes (LEDs) to achieve a reference color associated with the reference color data from the target color of the LEDs.

In accordance with another embodiment, a color correction panel includes a target panel including a plurality of target light emitting diodes (LEDs), a diffuser over the target LEDs to blend colors output from the target LEDs and a color corrector device coupled to the target panel. The color corrector device includes a computation engine including a processor and a memory coupled to the processor, the computation engine being configured to receive reference color data, a software application stored in the memory and configured to compute adjustment values needed to achieve the reference color data from a target color and an output configured to output color corrected signals to light emitting diodes (LEDs) to achieve a reference color associated with the reference color data from the target color of the LEDs.

A method for color correction includes computing a reference panel matrix ($P_R$) based on colors (which can be represented as data) of a reference panel light; computing a target panel matrix ($P_T$) based on light measured from a target panel; calculating an inverse matrix ($P_T^{-1}$) for the target panel matrix; representing input pulse width modulated (PWM) duty cycles as an input PWM vector ($d_R$); determining an output PWM vector ($d_T$) by multiplying the input PWM vector ($d_R$) by the reference panel matrix ($P_R$) and the inverse target panel matrix ($P_T^{-1}$); and driving an output PWM duty cycle of the target panel according to vector $d_T$ to achieve a color associated with the reference panel.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
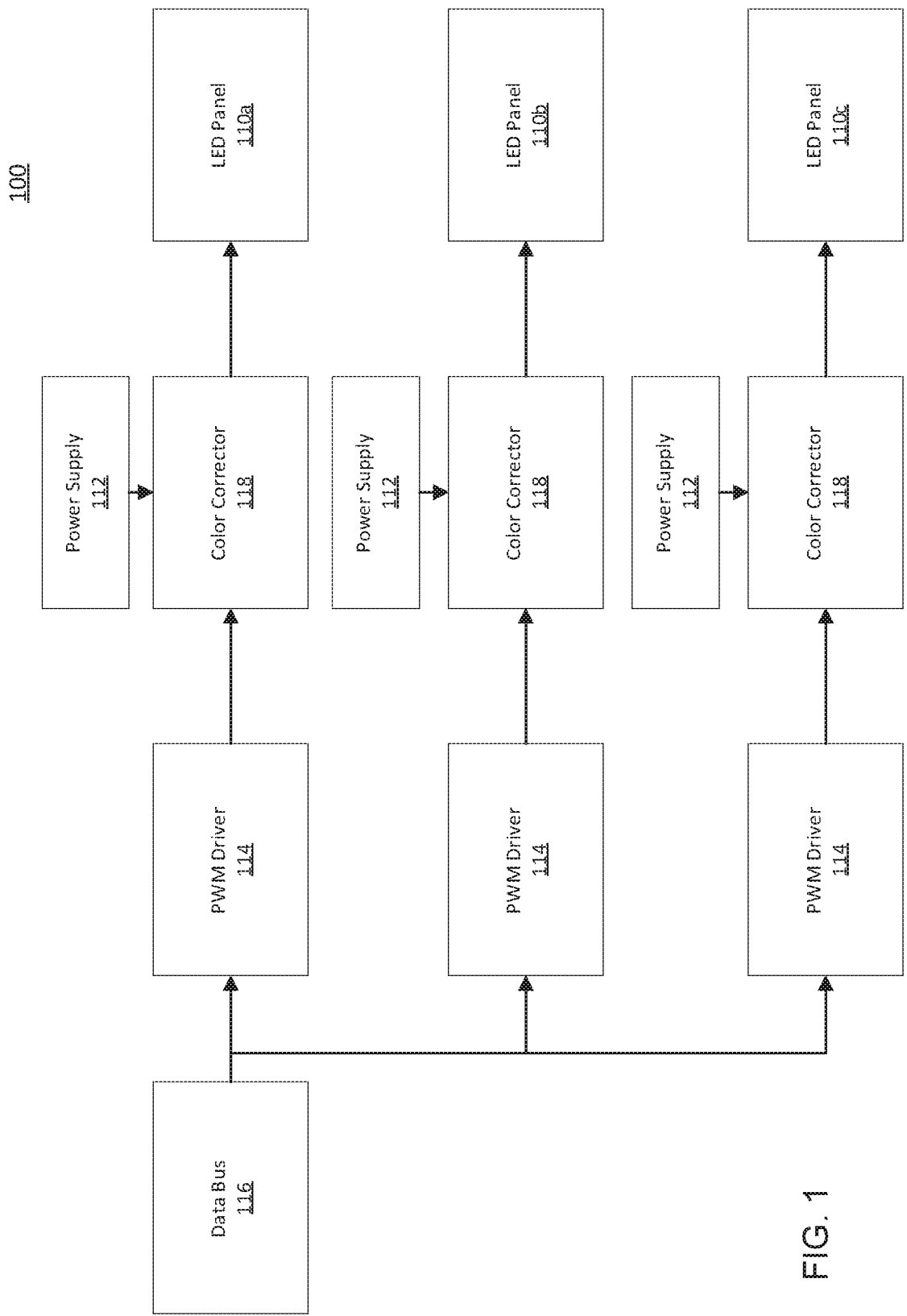
FIG. 1 is a schematic block diagram showing color correction devices adjusting pulse width modulated (PWM) duty cycles of PWM drivers for respective light emitting diode (LED) panels in accordance with an embodiment of the present invention.

In accordance with embodiments of the present invention, circuits, devices and methods are provided for color control of lighting devices within an environment. In one embodiment, a Light Emitting Diode (LED) lighting panel can be employed for an end customer installation or other use that includes a circuit board with numerous red/green/blue (RGB) and white light emitting diodes arrayed across the panel. The circuit board including the LEDs for the panel can be placed behind a diffuser to blend LED light together into a uniform brightness. The individual colors can also be blended together. This blending may or may not be distinguishable, as desired.

In useful embodiments, the panel can be configured to permit independent brightness control of each of the constituent colors, ranging from zero brightness to a maximum brightness value. This permits the perceived color of the panel to be set by choosing specific proportions of the colors. For example, red can be mixed with a small amount of green to produce orange or a larger amount of green to produce yellow. The individual colors are still present, but the eye of the human viewer blends the colors to arrive at a perceived color.

Relative brightness of the colors can be adjusted by modulating the signal to the LEDs. In one embodiment, Pulse Width Modulation (PWM) control can be employed for modulating the signal. Other modulation control methods are also contemplated by modifying other electrical characteristics, such as intensity, current, voltage magnitude, etc. It should also be understood that while LEDs are illustratively described herein, other light sources could benefit from the present principles. For example, color corrections of incandescent light groupings, pixel groupings, display monitor groupings, etc. can be employed, especially when a diffuser or similar light blending mechanism is employed. In useful embodiments, aspects of the present invention receive an input reference PWM value, then generate new PWM values to achieve the color that was intended by the input value.

In some useful embodiments, PWM is employed so the LEDs can be turned on and off at a high speed, such that blinking is not perceptible to the human eye. The percentage of the blink period that the LED is on is variable from 0% to 100% of the period. The periods are selected to provide the desired light component in sufficient quantity to enable a desired perceived color.

An installation can include a plurality of LED panels installed in a single location or multiple locations, where many panels are visible. Since it is difficult to control the perceived color which would normally vary from one panel to the next, all panels across the installation may not have one uniform color. This type of problem normally arises from normal production tolerances in the underlying RGB LEDs resulting in a dominant wavelength of one LED that does not match the others. For example, some green LEDs could appear "reddish" while others appear "blueish". In addition, the LEDs may not all have the same brightness. For example, one red LED might be brighter than another red LED, though driven with the same duty cycle and the same electrical conditions. These and other issues are overcome in accordance with embodiments of the present invention.

Exemplary applications/uses to which the present invention can be applied include, but are not limited to, LEDs. In addition, the present embodiments will be described in terms of illustrative circuits; however, other circuits that provide similar functions are also contemplated. It is to be understood that the present embodiments will be described in terms of a given illustrative architecture; however, other architectures, structures, components, process features and steps may be varied within the scope of the present invention.

It will also be understood that when an element is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language and stored in a computer storage medium (such as a disk, tape, physical hard drive, or virtual hard drive such as in a storage access network). Methods as described herein may be used in the fabrication of integrated circuit chips or boards. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections).

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath"

other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it ill also be understood that when a layer is referred to as being "between" two layers, it can be the only layer between the two layers, or one or more intervening layers may also be present. It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a schematic diagram shows a system 100 that illustrative shows three LED panels 110a, 110b and 110c (collectively referred to as panels 110 or panels 110, hereinafter). Each panel 110a, 110b and 110c, in this embodiment, is driven by it is own color corrector device 118. The color corrector device 118 can each include their own power supply 112, e.g., a constant-voltage power supply, or can share a power supply. The LED panels 110a, 110b and 110c can produce a same LED current from one panel 110a to a next panel 110b when driven with a specifically selected power supply voltage. The system 100 uses a PWM driver 114 for each of LED panels 110a, 110b and 110c, which drive the LEDs on each panel by turning the LEDs on and off at a high speed, to achieve PWM brightness control. This driver or controller 114 sets the PWM duty cycle in response to digital data, e.g., digital multiplexed data or DMX data, provided to the controller over a data bus 116 or other data source. In other embodiments, the driver 114 may be shared with a plurality of panels 110 or one PWM driver 114 can be used by a single panel 110 (e.g., each individual panel 110 has their own driver 114).

In some embodiments, the PWM driver 114 may not actually drive the LED panel 110. The output of the PWM driver 114 provides an input signal to the color corrector 118 to indicate the desired color, and the color corrector device 118 becomes a new PWM driver for the panel 110. In this case, no actual power flows from the PWM driver 114 to the panel 110. In alternate embodiments, the PWM driver 114 drives "through" the color corrector device 118 such that the color corrector device 118 modifies the PWM signal by keeping it on longer or cutting it shorter.

Color corrector devices 118 can be employed to modify the PWM duty cycles of colors (e.g., red, green, blue) on a given panel 110a, 110b, and/or 110c in such a way as to compensate for production tolerances of the LEDs. Each panel 110a, 110b, etc. can have its PWM duty modified to cause all panels to produce the same perceived color. The color corrector device 118 functions to read in target PWM values for red, green and blue and then uses a system of computations and adjustments, combined with unique calibration values for a given panel, to generate new PWM values or signals. When the panel 110a is driven with the new PWM values, it will produce the color that was originally intended, mimic the color of another panel or reproduce an "ideal" color. For example, RGB values of 50%, 20%, 0% might be expected to produce a yellow color on a "perfect" panel. However, if a given panel has green LEDs that are a little too "reddish" and not quite bright enough, the color might be orange instead. The color corrector device 118 could be employed to modify the PWM values to reduce the amount of red and increase the amount of green. For example, the modified PWM values might be 45%, 23%, 0%. Thus, a particular panel 110a, when driven with PWM values of 45%, 23%, 0% might produce the same desired yellow color as a "perfect" or "ideal" panel when driven with 50%, 20%, 0% duty cycles.

It should be understood that while embodiments are described herein to use red, green, and blue LED's, it is possible to employ other colors of LED's or with multiple shades of LED colors (e.g., bluish green, yellowish green, etc. as separate LED outputs). In addition, it is also possible to add colors to modify a white light.

In one embodiment, color corrector devices 118 can be connected directly between the PWM drives 114 and each panel 110. In some embodiments, color corrector device 118 and its associated PWM driver 114 can be hardwired to each panel 110 (e.g., board mounted). The PVM drivers 114 can include 24 Volt signal outputs, although other voltages can be employed.

Figure 2:
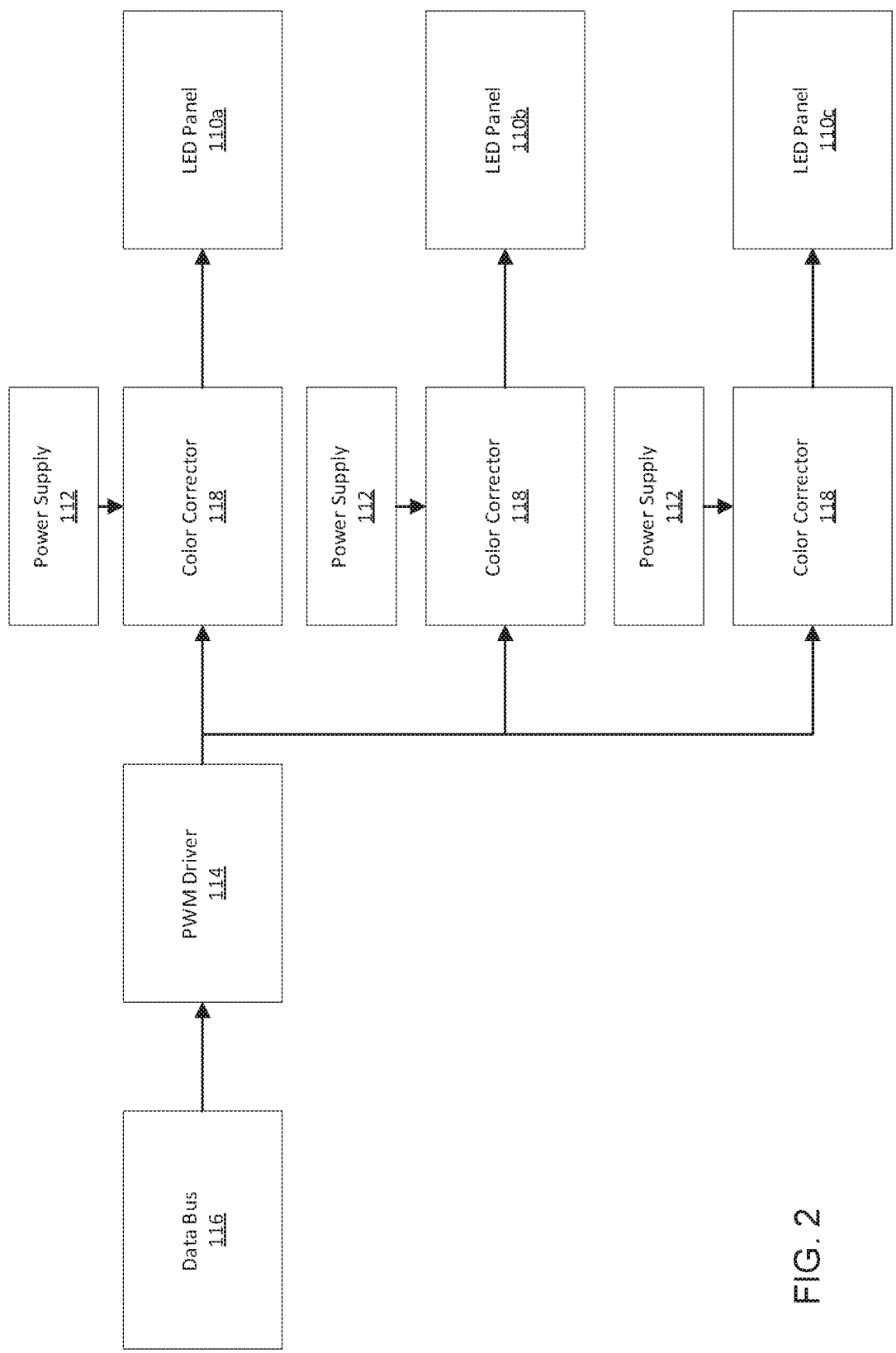
FIG. 2 is a schematic block diagram showing color correction devices for respective LED panels for adjusting PWM duty cycles of a single shared PWM driver in accordance with an embodiment of the present invention.

Referring to FIG. 2, another configuration of system 100 is depicted having a single PWM driver 114 shared among a plurality of color corrector device 118. The color corrector devices 118 can share the PWM input and output a color corrected signal (PWM output) to the LED panels 110a, 110b and 110c.

Figure 3:
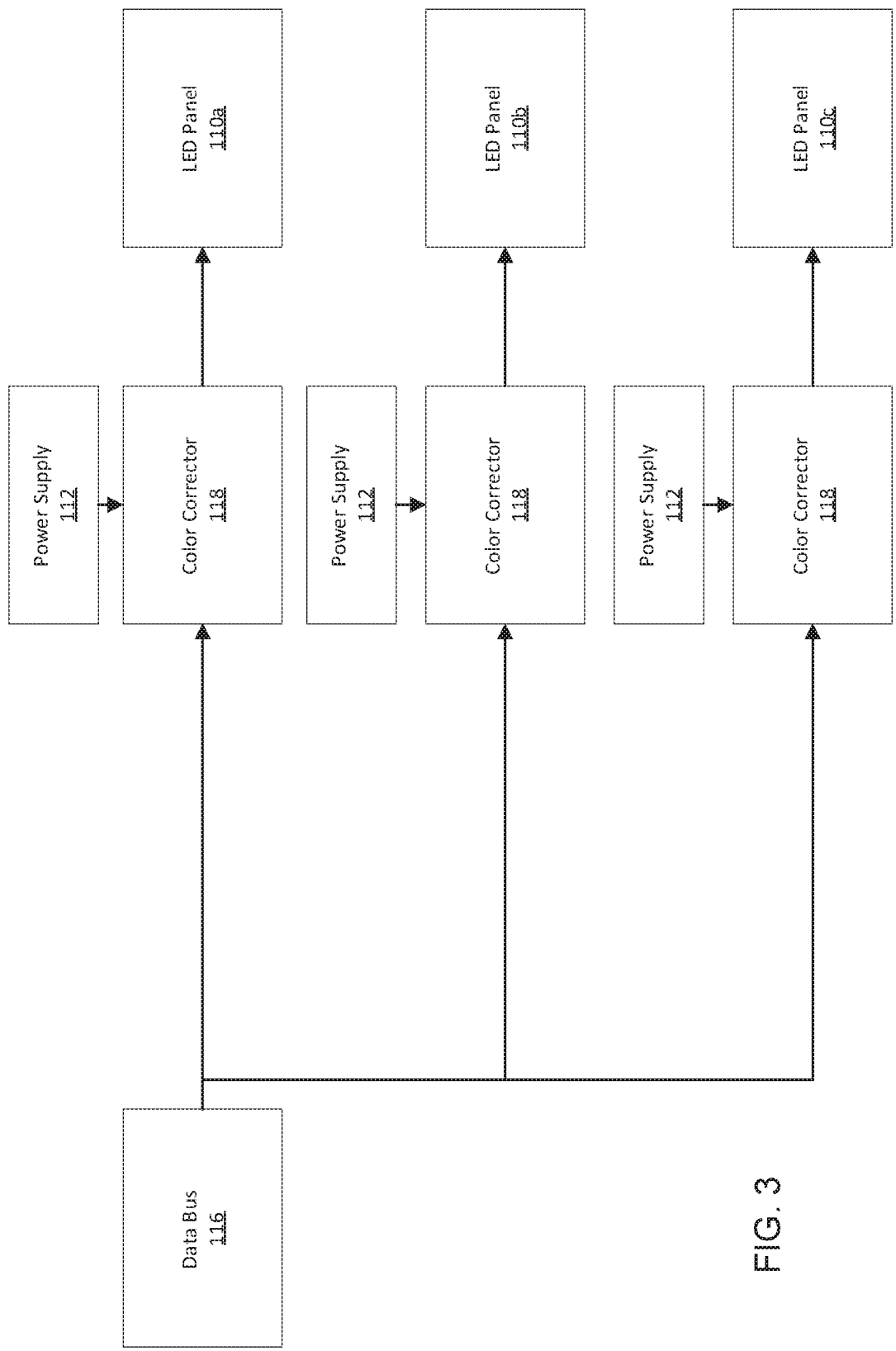
FIG. 3 is a schematic block diagram showing color correction devices adjusting PWM duty cycles and outputting PWM driver signals directly to respective LED panels in accordance with an embodiment of the present invention.

Referring to FIG. 3, yet another configuration of system 100 is depicted having PWM drivers 114 replaced by color corrector devices 118. The color corrector devices 118 receive color data from data bus 116. The data bus 116 can provide DMX data (e.g., DMX 512 data) to all of the color corrector devices 118. The color corrector devices 118 output PWM signals that account for color corrections for their respective LED panels 110a, 110b and 110c.

Figure 4:
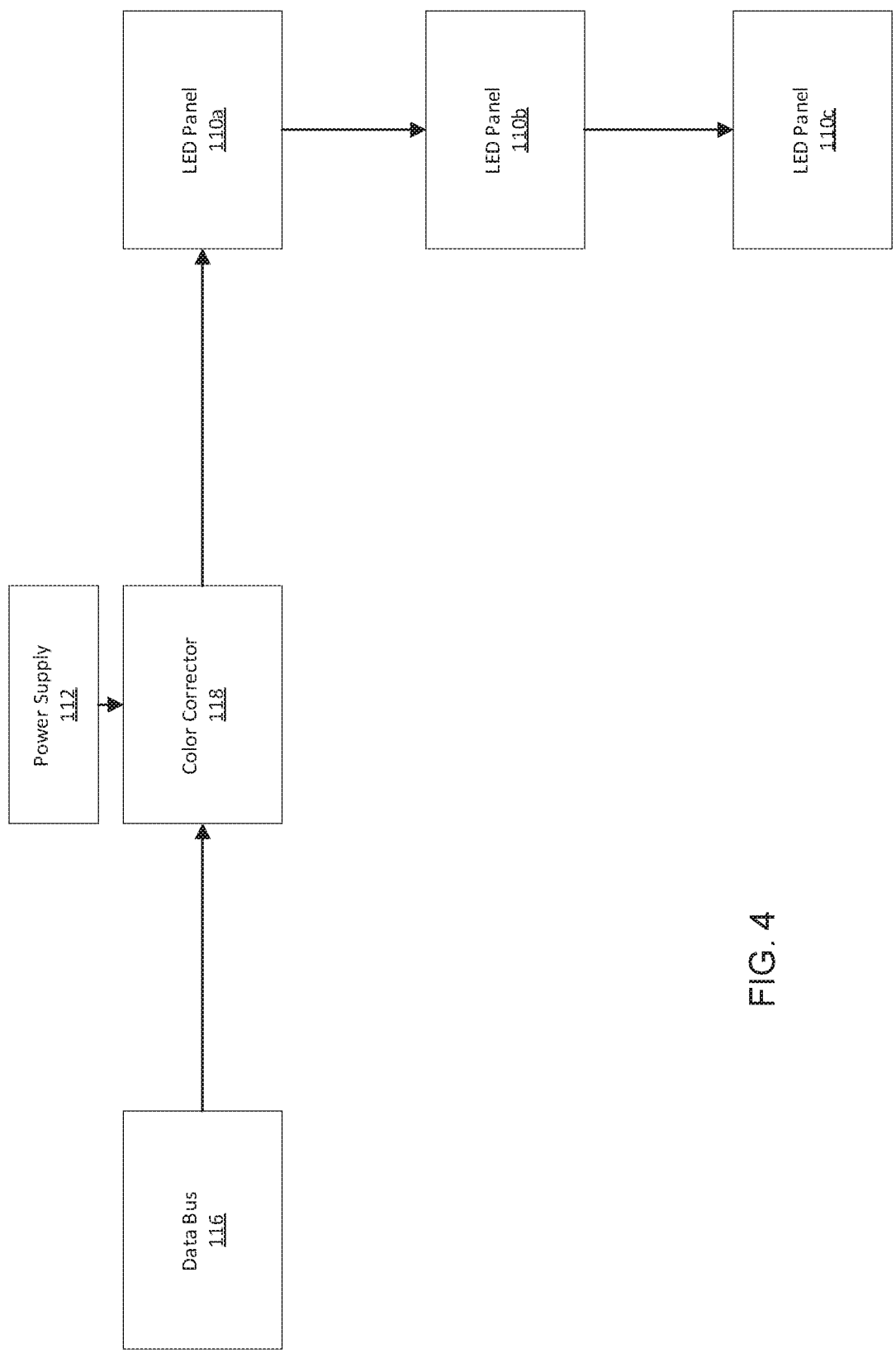
FIG. 4 is a schematic block diagram showing a color correction device adjusting PWM duty cycles and outputting PWM driver signals to respective a plurality of serially connected LED panels in accordance with an embodiment of the present invention.

Referring to FIG. 4, still another configuration of system 100 is depicted having PWM driver 114 replaced by color corrector device 118. The color corrector device 118 receives color data from data bus 116. The color corrector device 118 outputs PWM signals that account for color corrections for the LED panels 110a, 110b and 110c, which share the PWM signal information among the panels 110. Here, the color corrector device 118 is shared by a plurality of panels 110 and all the panels are color corrected concurrently and as a group.

Figure 5:
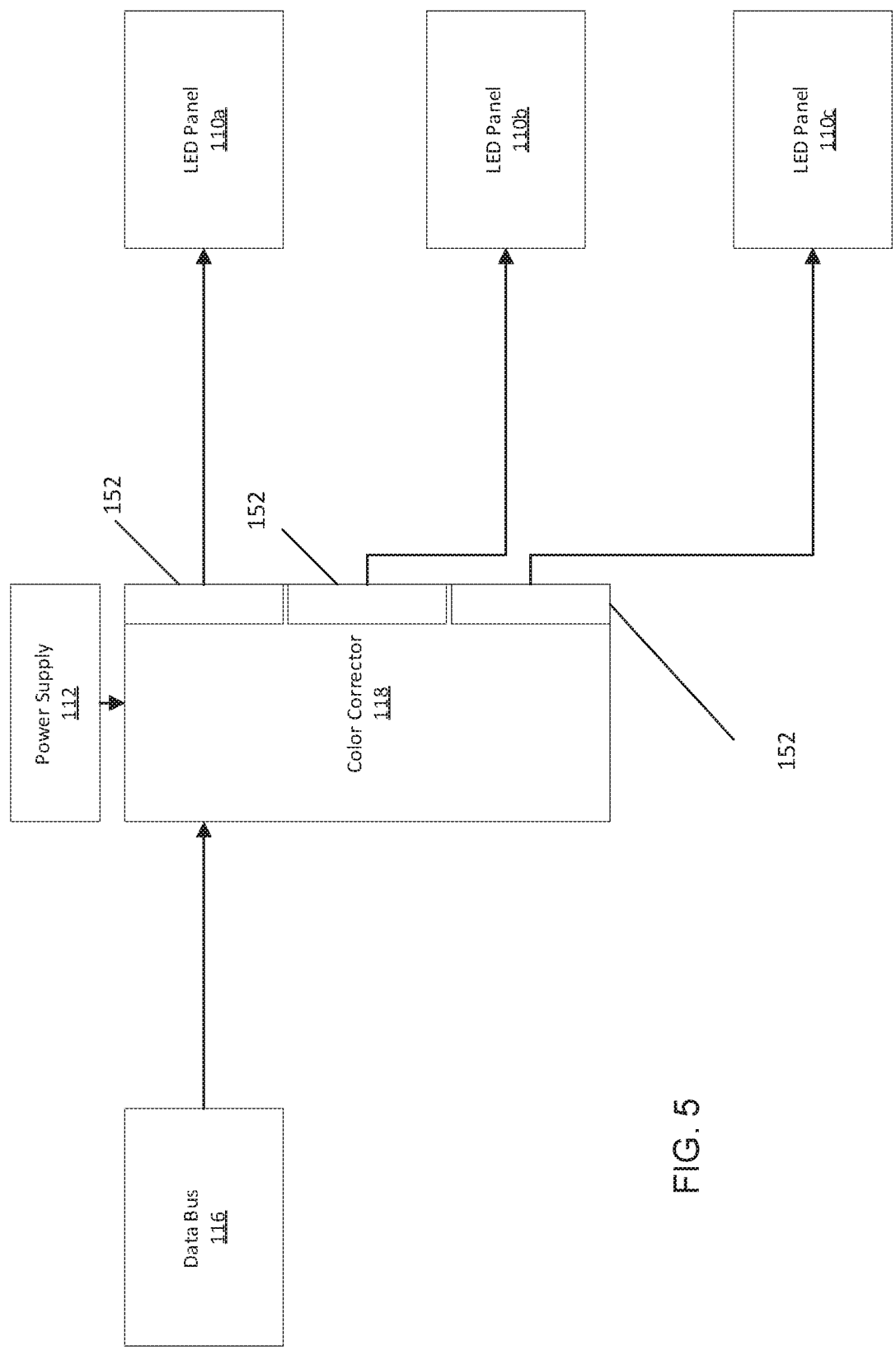
FIG. 5 is a schematic block diagram showing a color correction device adjusting PWM duty cycles and outputting PWM driver signals to a plurality of individual LED panels in accordance with an embodiment of the present invention.

Referring to FIG. 5, in another embodiment, the PWM driver 114 is replaced by color corrector device 118. The color corrector device 118 receives color data from data bus 116. The color corrector device 118 includes an output section 152 associated with each panel (110). Each output 152 outputs PWM signals that account for color corrections for each of the LED panels 110a, 110b and 110c, which each have their own PWM signal information. In this way, each panel 110a, 110b, 110c is individually color corrected.

Figure 6:
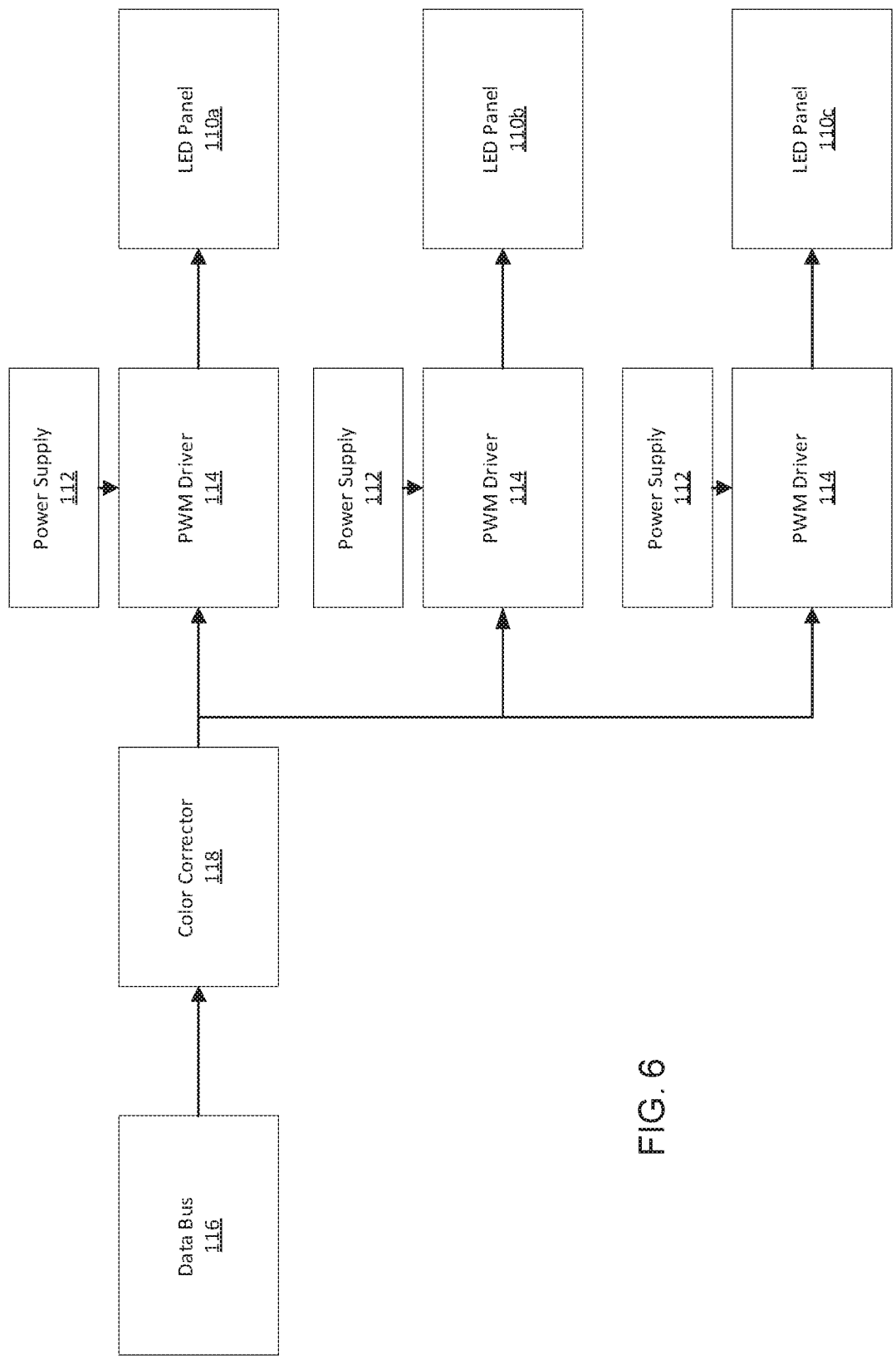
FIG. 6 is a schematic block diagram showing a color correction device adjusting PWM duty cycles and outputting PWM driver signals concurrently to a plurality of LED panels in accordance with an embodiment of the present invention.

Referring to FIG. 6, in another embodiment, the PWM drivers 114 correspond to their own respective LED panel 110a, 110b, 110c which is served by a single-color corrector device 118. The color corrector device 118 receives color data from data bus 116. The color corrector device 118 modifies the target color values and outputs modified DMX data to the appropriate PWM drivers 114. The PWM drivers 114 drive the LED panels using the corrected color data in the PWM signals to account for color corrections for each of the LED panels 110a, 110b and 110c, which each have their own PWM signal information to individually control each panel 110a, 110b, 110c.

Figure 7:
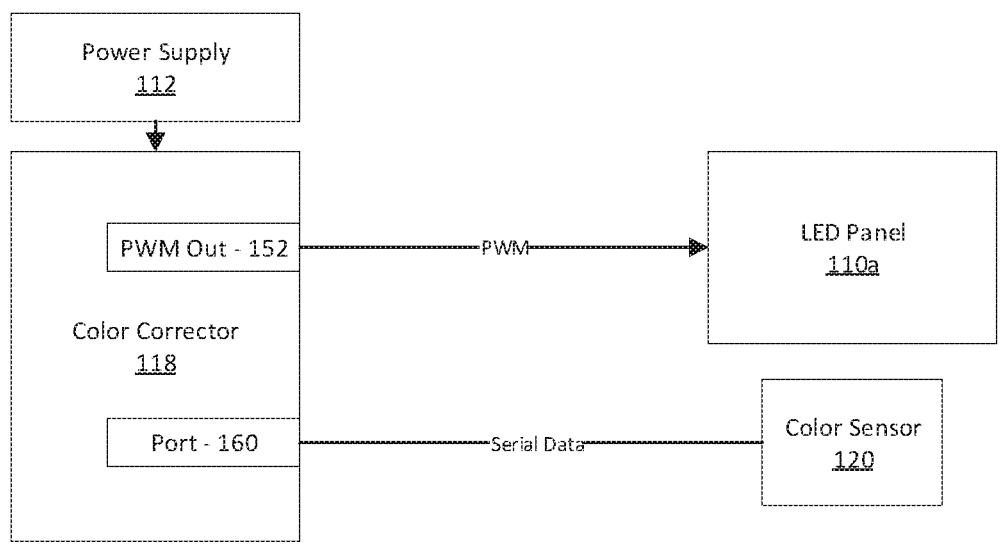
FIG. 7 is a schematic block diagram illustratively showing a calibration setup for measuring light output from a panel using a color corrector device in accordance with an embodiment of the present invention.

Referring to FIG. 7, a calibration setup is illustratively shown in accordance with one embodiment. The color corrector device 118 can derive calibration values for its calculations from a color sensor 120. The color sensor 120 can include an optoelectronic device that records the brightness values of red, green, and blue light independently. In one embodiment, a chromatic white color sensor providing direct XYZ color coordinates consistent with standard observer color coordinates can be employed. The color sensor 120 can include a printed wiring board or chip (e.g., CMOS in silicon) that maps the XYZ coordinates to the 2-dimensional color gamut and scales the coordinates to a coordinate system. The color sensor 120 can provide accurate Correlated Color Temperature (CCT) measurements in the coordinate system. In one embodiment, a Near-Infrared (IR) channel can be measured, as well. The color sensor 120 can integrates light and provide a built-in aperture to control the light entering the color sensor. In one embodiment, the color sensor 120 outputs serial data (e.g., serial UART).

The color sensor 120 can be calibrated to include response curves for respective colors to very closely mimic the response of the human eye. The measured values (e.g., serial data) for the three colors can then be taken from one panel (110a) to the next and received by the color corrector device 118 at port 160. The color will be perceived as the same to a typical human being or other criteria. In one example, for the yellow light correction described above, color spectra of the light for the "perfect" panel and the corrected panel would look notably different when viewed on a spectrometer. However, the values measured by the color sensor 120 would be identical and the color would appear identical to a human being.

During calibration, the color correction device 118 independently measures the contribution of each LED color (red, green, blue) to the red, green and blue channels of the color sensor 120. For example, the red LEDs might put out values of 800, 400, 20 on red, green and blue sensors of the color sensor 120. Meanwhile, the green LEDs will put out values of 300, 900, and 30 on the red, green and blue sensors. Each LED color produces some response in all three-color channels, not just the respective channels. The color sensor 120 can include photosensors, a photosensor array, an imaging chip, or any other sensor device that can measure these color components.

In one embodiment, the color corrector device 118 compares the calibration values for an ideal panel (from, e.g., DMX data) to the calibration values of the panel 110a being corrected. In other embodiments, the panel 110a can be compared to the light output of a reference panel or source (e.g., panel 110b). In other embodiments, the panels (110) at a given location can be compared to one another to arrive at a common perceived color.

While creating uniform perceived colors is useful, other embodiments can include varying the intended perceived colors to create differences in the perceived colors across different panels. The color corrector device 118 can employ linear algebra and matrix operations to predict how much the duty cycle of each color should be increased or decreased to arrive at the same input values on the color sensor 120. This provides a calibration result that is employed to adjust or produce the corrected PWM values used to drive the panel 110a from PWM Out 152.

Figure 8:
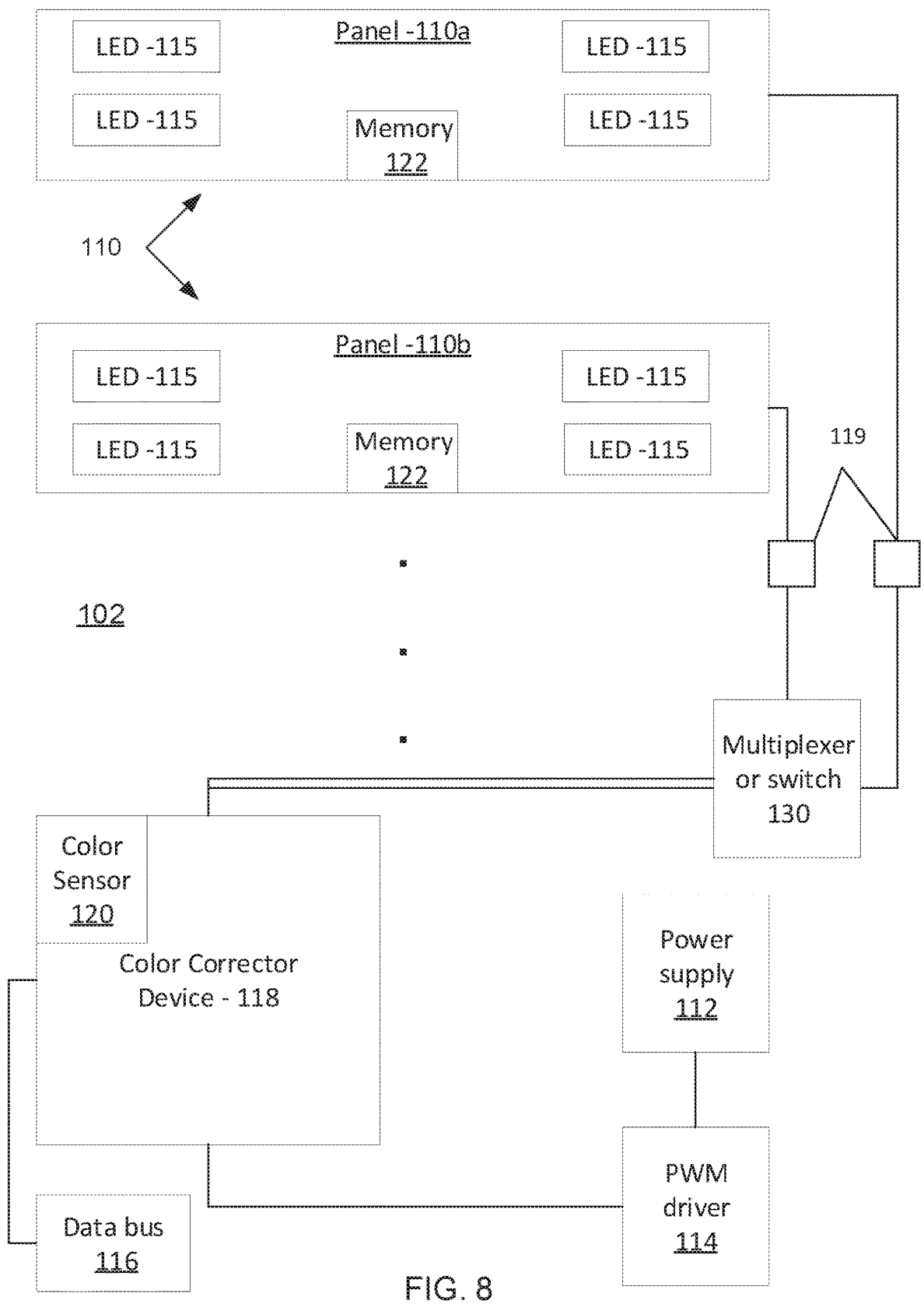
FIG. 8 is a schematic block diagram showing a color correction device programming light panels with correction data in accordance with an embodiment of the present invention.

Referring to FIG. 8, a schematic diagram shows a system 102 that illustratively includes two LED panels 110a and 110b. Panels 110a and 110b may include manufactured LED panels 110 that are being prepared for shipment. These panels 110a and 110b are compared to each other using color corrector device 118 and color sensor 120. The color corrector 118, power supply 112, PWM driver 114 can be configured in a number of different ways (e.g., see FIGS. 1-5).

The LED panels 110a and 110b can produce a same LED current from one panel 110a to a next panel 110b when driven with a specifically selected power supply voltage. The system 100 uses PWM driver 114 to turn LEDs 115 of the panels 110a and 110b on and off at a high speed, to achieve PWM brightness control. This driver or controller 114 sets the PWM duty cycle in response to digital data provided to the controller 114 over data bus 116 or other data source (measured data from the color sensor 120).

Calibration data computed by the color corrector device 118 can be employed to alter or generate duty cycles for driving the LEDs 115. The calibration data can be stored on the respective panels 110a and/or 110b. The panels 110a and/or 110b can be shipped with the color correction data stored in memory 122 on the respective panel 110a, 110b. In this way, when the shipped panel is received it can already be calibrated to match another panel, match an ideal color, etc. The stored data in memory 122 can be downloaded to a local color correction device 118 or employed with an existing setup having a PWM driver that can be configured to output color corrected PWM signals.

System 102 includes the ability to calibrate, correct and program color data onto the panels 110. The PWM driver 114 may be shared with a plurality of panels 110 or one PWM driver 114 can be used by a single panel 110 (e.g., each individual panel 110 has their own driver 114). The color corrector device 118 can be employed to modify the PWM duty cycles of colors (e.g., red, green, blue) on a given panel 110a (or 110b) in such a way as to compensate for production tolerances of the LEDs. Each panel 110a, 110b, etc. can be modified to cause all panels to produce the same perceived color. The color corrector device 118 functions to read in target PWM values for red, green and blue and then uses a system of computations and adjustments, combined with unique calibration values for a given panel, to generate new PWM values. When the panel 110a is driven with the new PWM values, it will produce the color that was originally intended, or mimic the color of another panel.

For example, RGB values of 50%, 20%, 0% might be expected to produce a yellow color on a "perfect" panel. However, if a given panel has green LEDs that are a little too "reddish" and not quite bright enough, the color might be orange instead. The color corrector device 118 could be employed to modify the PWM values to reduce the amount of red and increase the amount of green. For example, the modified PWM values might be 45%, 23%, 0%. Thus, a particular panel 110a, when driven with PWM values of 45%, 23%, 0% might produce the same desired yellow color as a "perfect" panel when driven with 50%, 20%, 0% duty cycles.

In one embodiment, the color corrector device 118 compares the calibration values for an ideal panel to the calibration values of the panel being corrected. In other embodiments, the panel 110a can be compared to the light output of a reference panel or source (e.g., panel 110b). In other embodiments, the panels at a given location can be compared to one another to arrive at a common perceived color. While creating uniform perceived colors is useful, other embodiments can include varying the intended perceived colors to create differences in the perceived colors across different panels. The color corrector device 118 can employ linear algebra and matrix operations to predict how much the duty cycle of each color should be increased or decreased to arrive at the same input values on the color sensor 120.

In one embodiment, color corrector device 118 can be connected directly between the PWM drive 114 and each panel 110. There may be a plurality of panels 110 so a single-color corrector device 118 can be employed by each panel 110 using a multiplexer or switch 130, or a color corrector device 118 can be shared among a plurality of panels 110. In other embodiments, a color corrector device 118 can be hardwired to each panel 110 or can be connected wirelessly to each panel 110. The panels 110 can be connected using connectors 119 and can be disassembled to ship the panels 110 with configuration data stored on-board in memory 122.

Figure 9:
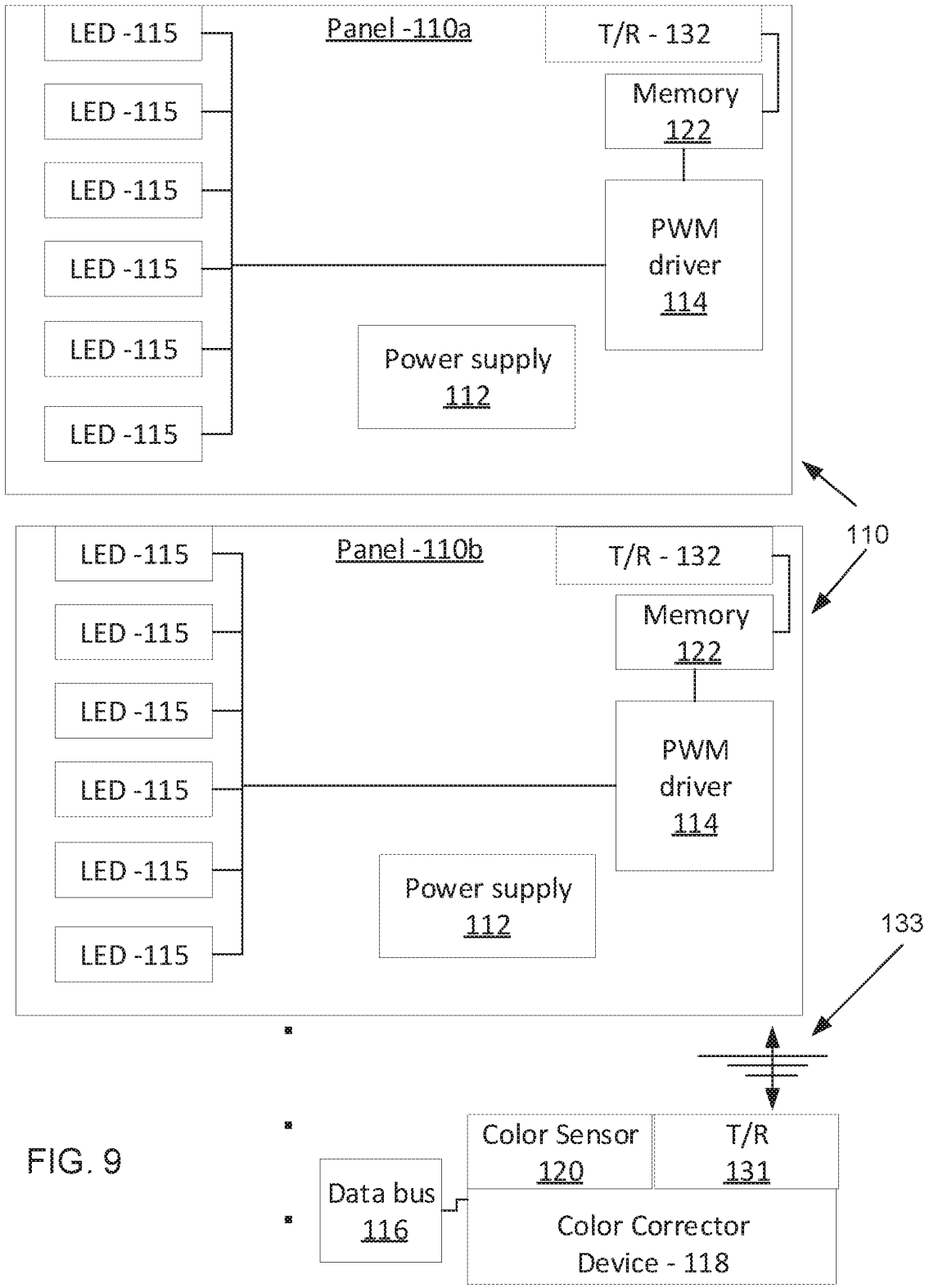
FIG. 9 is a schematic block diagram showing a color correction device wirelessly communicating with a plurality of panels in accordance with an embodiment of the present invention.

Referring to FIG. 9, a schematic diagram shows a system 104 that illustrative includes two LED panels 110*a* and 110*b* driven by one or more power supplies 112, e.g., a constant-voltage power supply. The power supply powers PWM drivers 114 to turn LEDs 115 of the panels 110*a* and 110*b* on and off at a high speed, to achieve PWM brightness control. The PWM drivers 114 are configured to receive color correction data control from a color corrector device wirelessly using transceivers 131 and 132. Color correction device 118 can be employed to calibrate the panels 110 using the PWM drivers 114 to adjust the color in accordance with ideal data (data bus 116), color sensor 120 (measured) or other source. The calibration data can be communicated to the memory 122 through transceivers 131 and 132. The calibrated data can be stored on the panel in memory 122 and employed by the PWM driver 114 to correct the color of panels 110.

System 104 includes wireless connections 133 between the color corrector device 118 and the panels 110. The panels 110 each can include transmitters and receivers (T/R) 132 or share a T/R 132 using a switch or multiplexer. Color corrector device 118 also includes T/R 131 to communicate wirelessly with the panels 110. The color corrector 118 can determine the adjustments needed for the PWM values and send the values to the panel 110. The values can be stored in memory 122 and employed to adjust the duty cycle output from the PWM driver 114.

Figure 10:
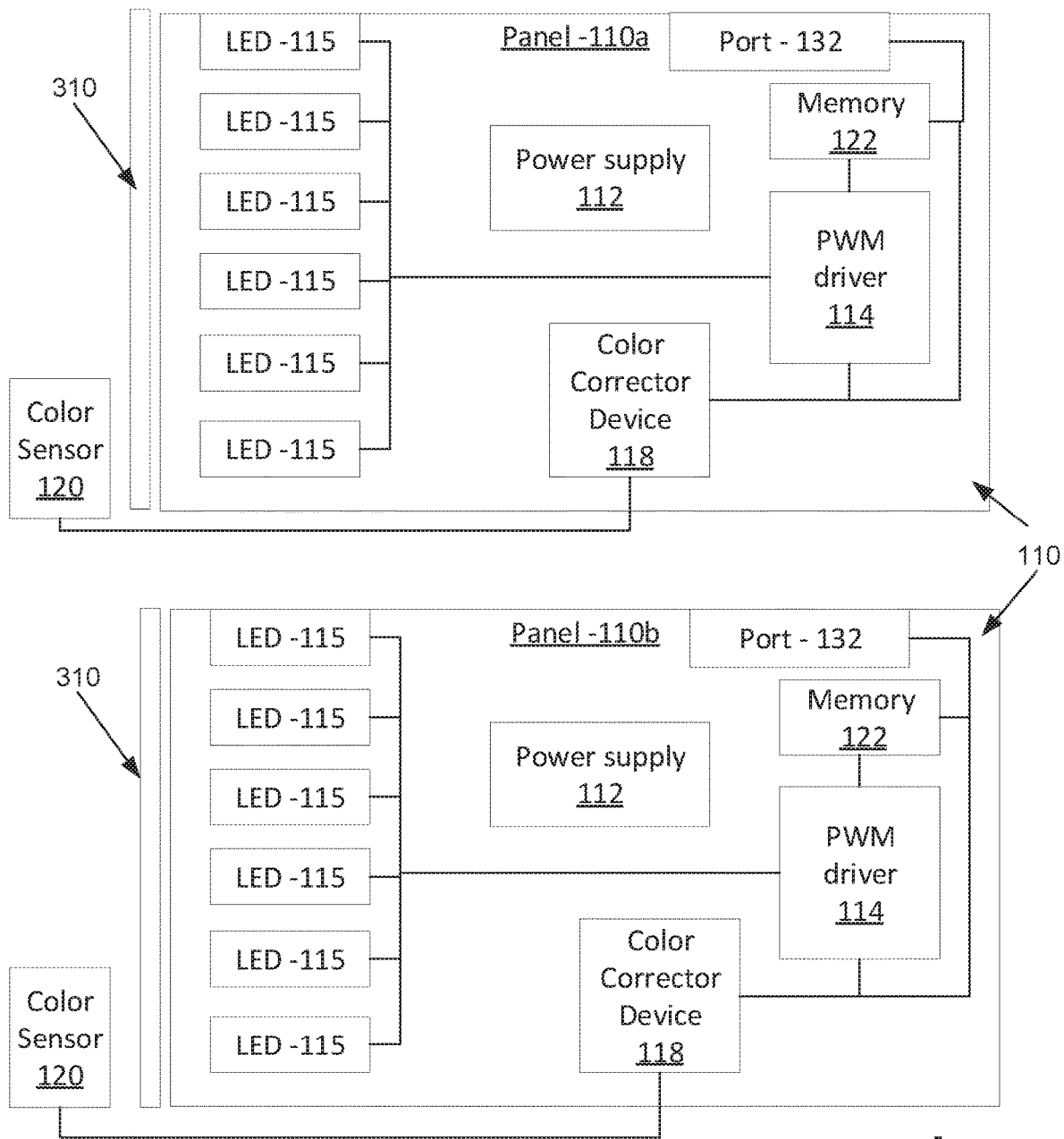
FIG. 10 is a schematic block diagram showing a plurality of panels having their own color correction device in accordance with an embodiment of the present invention.

Referring to FIG. 10, a schematic diagram shows a system 106 that illustratively includes two LED panels 110*a* and 110*b*. System 106 includes color corrector device 118 on each panel 110. The panels 110 each can include a color sensor 120 to measure light output from the panel 110, from a reference panel or source or from both. The color corrector 118 can determine the adjustments needed for the PWM values and perform one of the following processes. The color corrector 118 can function as the PWM driver and can dynamically update the PWM signals to correct for color. In another embodiment, the color corrector 118 can send the corrected PWM values to the memory 122 and employ these values to configure the PWM driver 114 to output the corrected color values. the PWM driver 114. The values can be stored in memory 122, or the PWM driver 114 can be employed to adjust the duty cycles output from the PWM driver 114. The color correction device 118 can receive calibration data from the color sensor 120 or through data port 132.

It should be understood that in some embodiments, the memory 122 can be used to store calibration values that are used in a correction calculation. In an alternate embodiment, the memory stores a lookup table of pre-calculated or pre-optimized corrected values for a limited number of target colors. This permits "tweaking" the values and potentially getting better results than the calculations yield, but it may limit the range of colors that can be corrected. Lookup tables may also be employed in the color correction device 118 to reduce processing resources (by avoiding computations) or lookup tables may be employed in certain applications were color differences are repeatable or small.

It should also be understood that the panels 110 can include a printed wiring board, LED strips, LEDs circuits or any other LED or light configuration that employs multiple color components combined to achieve a particular color light output. The present principles are applicable to color correction between segments of a same panel or light device as well especially when multiple PWM drivers are employed.

In accordance with an illustrative application of the present invention, color matching control between two or more LED panels 110*a*, 110*b* within an environment can be provided. LED lighting panel 110*a* can be employed for an end customer installation that includes a circuit board with numerous red/green/blue (RGB) and white light emitting diodes arrayed across the panel 110*a*. The circuit board can be placed behind a diffuser 310 to blend/mix LED light together into a uniform brightness. The individual colors can also be blended together. This blending may or may not be distinguishable as desired.

In useful embodiments, the output of the LEDs is mixed using diffuser 310 to blend LED light together. The color corrector device 118 shortens or lengthens duty cycles to adjust the color combinations to arrive at a particular result. In one embodiment, the result includes a uniform color appearance for a plurality of light panels 110. The plurality of light panels 110 may be included in a single display such as a billboard, indoor lighting scenario of showcase. The new PWM values can be delivered to the panels 110 in a plurality of ways. For example, the PWM driver can be programmed with the new values, the panels 110 can include memory 122 that stores the PWM values which are accessed directly to control the LEDs 115 or the color corrector device 118 stores or generates the new PWM values for the LEDs 115 on the panels 110. The stored values of the color corrector device 118 can be individually stored for panels 110 and applied to the correct panel 110 in accordance with a multiplexer and/or in accordance with the data on the data bus 116.

In useful embodiments, the panel 110 can be configured to permit independent brightness control of each of the constituent colors, ranging from zero brightness to a maximum brightness value. This permits the perceived color of the panel 110 to be set by choosing specific proportions of the colors. For example, red can be mixed with a small amount of green to produce orange or a larger amount of green to produce yellow. The individual colors are still present, but the eye of the human viewer blends the colors to arrive at a perceived color.

Relative brightness of the colors can be adjusted by modulating the signal to the LEDs. In one embodiment, Pulse Width Modulation (PWM) control can be provided using the color corrector device 118 employed for modulating the signal. Using PWM, the LEDs can be turned on and off at a high speed, such that blinking is not perceptible to the human eye. The percentage of the blink period that the LED is on is variable from 0% to 100% of the period.

A customer installation can include a plurality of LED panels 110 installed in a single location, where many panels 110 are visible from one position. Since it is difficult to control the perceived color which would normally vary from one panel to the next, all panels across the installation may not have one uniform color. This type of problem normally arises from normal production tolerances in the underlying RGB LEDs resulting in a dominant wavelength of one LED that does not match the others. For example, some green LEDs could appear "reddish" while others appear "blueish". In addition, the LEDs did not all have the same brightness. For example, one red LED might be brighter than another red LED, though driven with the same duty cycle and the same electrical conditions.

In one embodiment, the color corrector device 118 can use the color sensor 120 to measure one panel (reference 110a) against the other (target 110b) and provide PWM values to make adjustments to color. In one embodiment, the color corrector device 118 can compare the target 110b to an ideal reference stored in the device 118 or provided by a data stream to the device 118. In one embodiment, the color corrector device 118 can provide the PWM values to the panels 110 to be stored in panel memory and used to control a PWM driver on the panel 110 or can provide the actual corrected signals to the panels 110 if the device 118 acts as the PWM driver. In some embodiments, the device 118 can be connected directly to the panel or panels 110, and in other embodiments, the device 118 can be wirelessly interfaced to the panels 110 and/or to other devices to provide information to and from the device 118.

The device 118 adjusts the duty cycles to alter the amount of "on" time for LEDs and/or their component colors. In this way, the color of the panels with mixed color components can be matched or otherwise adjusted to achieve a desired color result or pattern. The adjustments can be produced by the amount of time a given LED is active taking in consideration the LEDs color. The duty cycle adjustment adds or subtracts the color components to create a resultant perceived color through the diffuser 310 that matches a desired color or matches another perceived color, e.g., from a nearby panel or a reference panel. The duty cycle adjustments optimize the needed color components such that the total resultant color is as desired. While diffuser 310 is employed in some embodiments, other blending devices and techniques can be employed. These can include the arrangement of LED types on the panel, the distance at which the panel will be viewed (a long distance blends the colors more than a short distance), etc.

Figure 11:
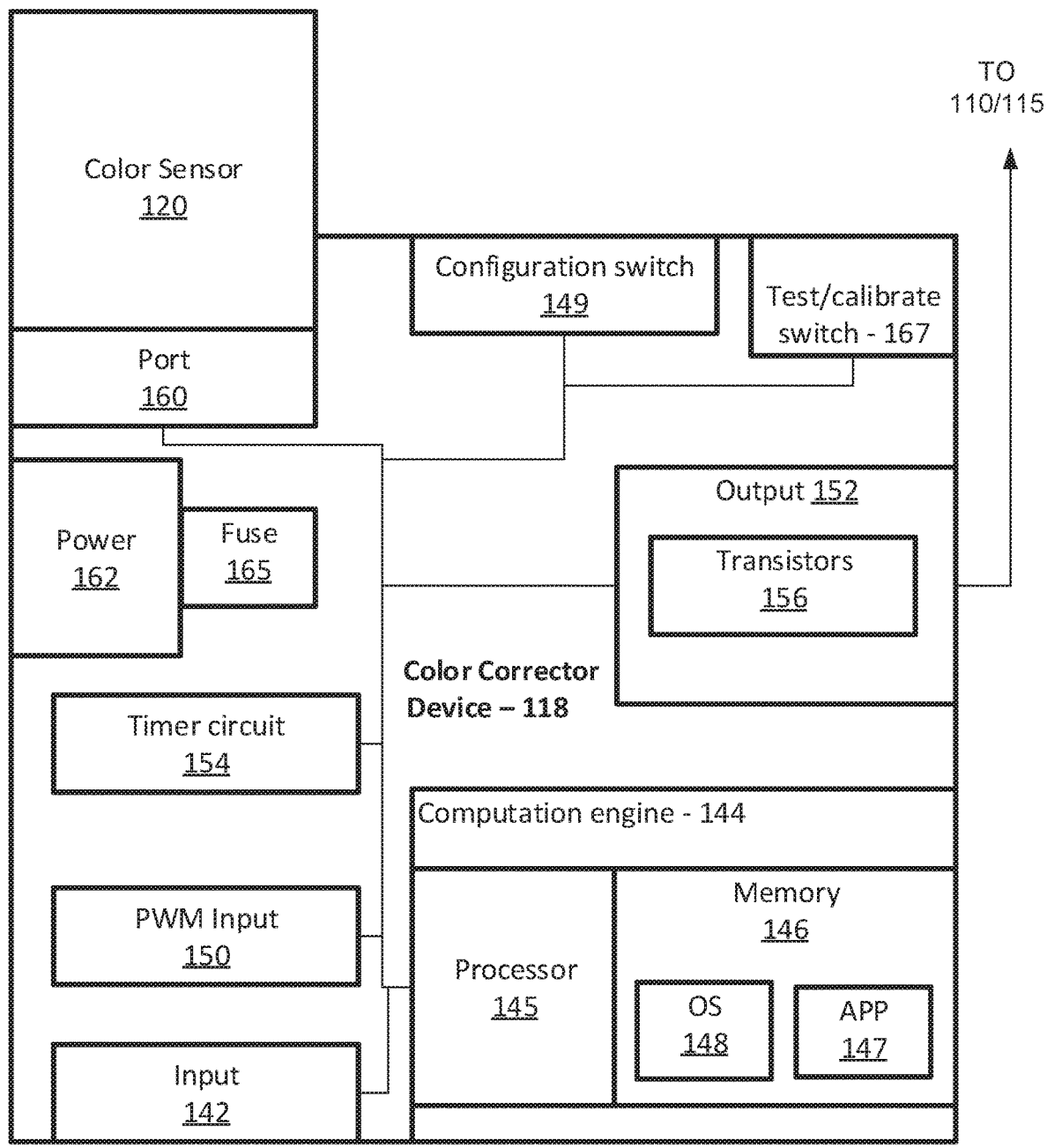
FIG. 11 is a schematic block diagram showing a more detailed color correction device for adjusting color uniformly in light emitting diodes in accordance with an embodiment of the present invention.

Referring to FIG. 11, the color corrector device 118 includes an input 142 to receive target PWM values. The target input values can be calibrated, measured or assigned (e.g., an ideal panel). The input 142 can include a standard port that can receive input from a wired or wireless methodology. The color corrector device 118 can be connected to a computer, a cell phone or other device suitable for transmitting PWM values. An input 150 can be connected to a device that generates PWM signals while input 142 would be connected to a device that generates a data stream, such as, e.g., a DMX512 controller.

In other embodiments, the color correction device 118 can be employed to generate or measure its own PWM values. The color corrector device 118 includes a computation engine 144 to generate corrected PWM values. The computation engine 144 can include one or more of the following and combinations thereof: processor chip or chips 145, memory 146, an operating system (OS)/software applications 148, a programming interface/peripherals (e.g., hardware switches, 149, keyboard, mouse, etc.), and an output 152. The color corrector device 118 also includes a port 160 for a color sensor 120 or a color sensor 120 can be built into the color corrector device 118, to be used during the calibration process.

Once new PWM values are determined. The color corrector device 118 can interface with a PWM output driver 114 associated with one or more LED panels (110) or the color corrector device 118 can function as the PWM driver. The color corrector device 118 can be configured to compute new, corrected PWM values to drive the LEDs at the new, corrected PWM values. The new, corrected PWM values will be employed to provide the desired perceived color output from the panels 110. In some embodiments, new PWM values can be stored in a lookup table. The new PWM values can be computed and stored or simply uploaded and stored. The memory 166 can store calibration factors used in the calculations.

The color corrector device 118 can read or generate the target PWM values in a number of ways. For example, a user can select the input method by a configuration switch 149. The input methods can include measured, calibrated or assigned values. These can be provided at the input 142 or PWM input 150 or determined internally using the processor 145 on the color corrector device 118.

In one embodiment, the color corrector device 118 uses PWM input circuits 150. The color corrector device 118 uses input circuitry 150 and timer circuit(s) 154 to generate output or corrected PWM values. The color corrector device 118 can accept a digital data stream directly, e.g., from a DMX data bus at input 142.

Data (e.g., DMX) can be received at the input 142 which can be employed as a target for color compensation (e.g., an ideal color to be achieved). This can be compared to measured color information collected using the color sensor 120. These inputs are provided to the computation engine 144, which includes one or more processors 145, e.g., microprocessor chip(s) or any suitable processing device. Memory 146 can include volatile, nonvolatile, random access memory (RAM), electrically erasable programmable read only memory (EEPROM), etc.

For the color corrected panels, e.g., panel 110, to look the same, the input PWM values need to make the perceived colors match from one panel to the next. In this case, the color corrector device 118 can replace the original PWM driver 114 entirely and instead act as the PWM driver 114. When configured in this way (after calibration), every panel on the system can read the exact same target PWM input values because the values are contained in digital data that is not subject to measurement error. In this embodiment, the target values come from the DMX data input instead of PWM input, which to avoid measurement error. In some embodiments, PWM drivers 114 can be included with the color correction device 118 when more than one modality or input is needed or desired.

It should be understood that the color corrector device 118 could be hardwired into a light panel circuit or can be a stand-alone unit that can communicate with light panels. In still other embodiments, the color corrector device 118 can be a portable device that can interface with interface with memory 122 (FIGS. 8-10) on the light panels. The memory 122 can store the new, corrected PWM values as determined by the color corrector device 118.

The computation engine 144 can employ computations to combine the input PWM target values with calibration parameters to calculate new output PWM values. An output PWM driver or section 152 of the device 118 can include an open-drain PWM chopper, similar in implementation to the output of the PWM driver 114. Transistors 156 of the driver circuit 152 are gated (turned on and off) to generate the corrected color duty cycles. The transistors 156, can include MOSFETs or other suitable transistors devices are employed to apply a constant voltage of the power supply 112 through a power connection 162 in accordance with the duty cycle signals. The LEDs 115 are turned on and off in accordance with adjusted or generated PWM duty cycle signals. The transistors 156 may be pulsed at any rate. The color corrector device 118 is not limited as to a particular pulse rate and has the benefit of being able to pulse the LEDs 115 at any rate, which is not the case for conventional PWM drivers. This allows for the ability to adjust the frequency as dictated by a particular installation. The transistors 156 provide high performance switching to enable accurate duty cycle control in accordance with timed pulses. Timer circuits 154 are employed to control the timing of signals which correspond to the amount of time that each LED or color component of the LED should be generating light. Higher rates are preferred because the possibility of visible flicker is reduced. However, lower rates may be needed to achieve the necessary duty cycle accuracy.

Duty cycles are controlled using the activation or the transistors 156 which are gated in accordance with the timing circuits 154 and the corrected color adjustments. When "on" the transistors 156 power the LEDs 115 from power source 162 which can be connected to a power supply 112 (See e.g., FIGS. 1-10). The power supply 112 can power the color corrector device 118 as well, although in a portable scenario, the power 162 may include a portable power source. The timing signals of the timing circuits are controlled using one or more of: the computation engine 144, data from the input 142, PWM input 150 or other inputs. The input mode can be selected manually using the configuration switch 149 (or other user interface) or automatically using the computation engine 144. The configuration switch 149 can also include a setting for a calibration mode. the calibration mode enables measurements to be made using the color sensor 120 or other device.

The color corrector device 118 may include port 160, such as a serial data port or other data port to communicate with the color sensor 120. The color corrector device 118 includes the power source or connector 162. The power source 162 can include a battery or other portable energy storage or can include a power connection to interface with the power supply 112 or other power source.

The color corrector device 118 includes PWM frequency control. As noted above, the PWM frequency of the device 118 can be varied as needed. In one embodiment, the device 118 varies the PWM frequency (output 152) according to duty cycle. High PWM frequencies (e.g., 5 kHZ or higher) may be desirable for LED brightness modulation. High frequencies eliminate visible flicker and reduce the possibility of color bands appearing on a digital camera (still or video). However, for the color correction to accurately match the perceived colors of panels, very precise duty cycle control is needed, especially at low duty cycles. An orange color that has 20-50% levels of red and green might also have a small amount of blue light to match from one panel to the next. The blue light might have a duty cycle on the order of, e.g., 2%. In this case, a difference in duty cycle as small as 0.5% could have a very pronounced effect on the final color and could ruin the color matching effect.

The LED panels in an installation can have physical limitations that prevent them from achieving acceptable duty cycle accuracy at high frequencies. In the example, with a PWM frequency of 5 kHz and a duty cycle of 2%, the LED is only turned on for 4 microseconds. The LED panel 110a directly connected to the driver 114 could potentially turn on within 1 microsecond. However, due to inductance in system wiring, the LED panel 110a at the end of a cable may need 10-15 microseconds to turn on. This means that at a 2% duty cycle, the last panel in the chain will emit essentially no blue light because it has not yet had a chance to turn on.

A solution causes the driver 114 to lower the PWM frequency when duty cycles are very low. The PWM frequency scales to a range of different values, depending on the duty cycle. The values are picked to ensure that, e.g., the 10-15 microseconds of rise and fall time of the LEDs 115 is never enough to significantly distort the desired on-time. For example, if the desired on-time is 100 microseconds then a 10 microsecond turn on time will be a 10% distortion.

In many PWM systems, lowering the frequency is not an option. LEDs can flicker, inductor currents can get too high, solenoids can chatter, etc. However, in accordance with the present embodiments, using the color corrector device 118, the lower frequency is acceptable because of the nature of the system. One characteristic that limits the minimum PWM frequency in LED dimmers is flicker. At low frequencies, the human eye can perceive a flashing of the LED. However, the minimum frequency for acceptable flicker levels is dictated by the depth of modulation. If the LED brightness only varies by 10%, then it is allowed to turn on and off at a low rate. If the LED brightness varies by 100% then the PWM frequency needs to be much higher. With the device 118, an LED with a low duty cycle (e.g., a blue LED at 2% in the above example) turns on and off with 100% modulation. However, the total light of the blue LED is very small compared to the light from the red and green LEDs. As a result, the overall depth of modulation for a light fixture is very small. The blue LED will be driven at a low frequency because of its low duty cycle while the red and green LEDs will be driven at higher frequencies because of their higher brightness.

The LEDs 115 are preferably not driven at more than about 33% duty cycle to reduce the chance of overheating of the panel. In many such PWM applications, three outputs would be three channels of a same timer. The result is that all of the LEDs turn on at the exact same instant. Even if the LEDs are all on for a 10% duty cycle, they will be on for the same 10% period. This results in a very high ripple current in the system's capacitors and a lot of electrical noise.

In accordance with aspects of the present invention, the device 118 staggers the three output colors by 33% of a cycle. As a result, the three colors are never on at the same time. If the three colors are all set to 10% brightness then they will turn on, e.g., as follows: Red from 0% to 10%, Green from 33% to 43%, Blue from 66% to 76%. This results in lower ripple currents at higher frequencies, which are easier to filter and less stressful on the components.

The color corrector device 118 can be a printed wiring board or can be fabricated on a semiconductor chip. In one useful embodiment, the color corrector device 118 is included on a board implemented in the panels 110 or connected to the LEDs 115 on the panels 110. In other embodiments, the color corrector device 118 can be a stand-alone device that can work with other components remotely (e.g., wirelessly) or by making wired connections to other components. For example, the color corrector device 118 can be powered by a power supply 112, an off-chip power source connected to power 162, by a portable power source (e.g., battery), etc. The color corrector device 118 can include a fuse 165 or other protective circuitry. The color corrector device 118 can include a manual test or calibrate button 167 that can enable color sensor 120 readings or measurements, run a self-test, etc. Other functions, circuits, interfaces, displays, etc. are also contemplated.

The computation engine 144 is configured to perform the comparisons and adjustments to PWM values to ensure color correction. The computation engine 144 can include memory 146 and software (application 147) to perform computations. In one embodiment, the computation includes linear algebra and the color is based on RGB values. In one feature, color correction involves taking in the duty cycles applied to a "reference" panel and find the necessary duty cycles to use on a "target" panel to have the two overall panel colors match.

Define: Duty cycle vector applied to the reference panel:

$$d_R = \begin{bmatrix} R \; Duty \; Cycle \\ G \; Duty \; Cycle \\ B \; Duty \; Cycle \end{bmatrix}$$

Duty cycle vector applied to the target panel:

$$d_T = \begin{bmatrix} R \; Duty \; Cycle \\ G \; Duty \; Cycle \\ B \; Duty \; Cycle \end{bmatrix}$$

Reference panel matrix:

$$P_R = \begin{bmatrix} X_R & X_G & X_B \\ Y_R & Y_G & Y_B \\ Z_R & Z_G & Z_B \end{bmatrix}$$

Target panel matrix:

$$P_T = \begin{bmatrix} X_R & X_G & X_B \\ Y_R & Y_G & Y_B \\ Z_R & Z_G & Z_B \end{bmatrix}$$

Reference panel bias matrix:

$$B_R = \begin{bmatrix} X_{R\_b} & X_{G\_b} & X_{B\_b} \\ Y_{R\_b} & Y_{G\_b} & Y_{B\_b} \\ Z_{R\_b} & Z_{G\_b} & Z_{B\_b} \end{bmatrix}$$

Target panel bias matrix:

$$B_T = \begin{bmatrix} X_{R\_b} & X_{G\_b} & X_{B\_b} \\ Y_{R\_b} & Y_{G\_b} & Y_{B\_b} \\ Z_{R\_b} & Z_{G\_b} & Z_{B\_b} \end{bmatrix}$$

Reference panel bias vector:

$$b_R = \begin{bmatrix} b_X \\ b_Y \\ b_Z \end{bmatrix}$$

Target Panel bias vector:

$$b_T = \begin{bmatrix} b_X \\ b_Y \\ b_Z \end{bmatrix}$$

Matrices and vectors can be determined based on measured characteristics of a panel, a reference light or lights, assigned PWM values, derived values, ideal values or any combination of these or other inputs. For example, the reference panel matrix $P_R$ can be found where each column of $P_R$ represents how the X, Y, and Z values of the sensor 120 change when the R, G, and B duty cycles are being adjusted. $B_R$ provides biases associated with each of these values. For example, $Y_R$ shows how the Y readings change per percent change in the red duty cycle with a bias of $Y_{R\_b}$ from the $B_R$ matrix. It should be understood that the bias matric and vectors provide an additional level of complexity to the computation. In some embodiments, the bias vectors and matrices can be omitted to reduce computational complexity.

Figure 12:
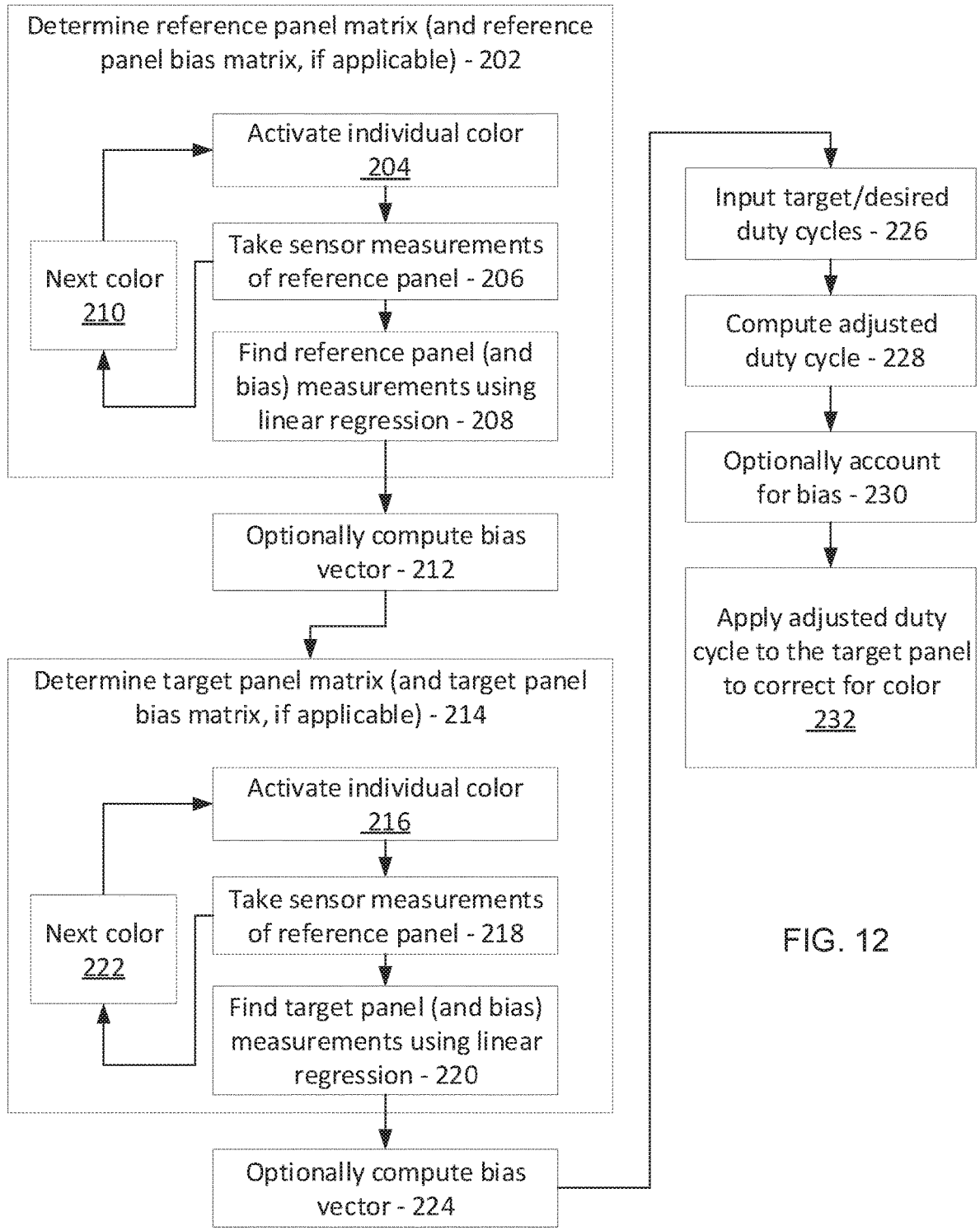
FIG. 12 is a flow diagram showing methods for computing adjusted pulse widths to color compensate lighting devices or fixtures in accordance with an embodiment of the present invention.

Referring to FIG. 12, a flow diagram shows an illustrative process flow for computing or generating PWM update values using the computation engine 144 and one or more processors 145 in the device 118. It should be understood that while the device 118 can include the computational capability for updating the PWM values, it is contemplated that these values can be computed elsewhere and loaded onto the color corrector device 118.

In accordance with one illustrative embodiment, in block 202, $P_R$, $B_R$ and $b_R$ are determined based on measurements, DMX data input or other inputs. in some embodiments, $B_R$ and $b_R$ can be omitted. This includes the following. In block 204, the duty cycle values are initialized for particular color components. E.g., two colors are initialized to a start value to address the third. For example, turn on one of the LED colors, take readings, then turn off that color and proceed to the next color (through block 210). Each color is sampled a number of times (e.g., four times at different brightness levels, e.g., 25% red, 50% red, 75% red, 100% red, etc.). Here, G and B duty cycles are set to 0% to initialize the duty cycle values to address R color. This will be done in the same way for each other color later in the process. In block 206, optical sensor measurements of X, Y, and Z values of the reference panel are taken at various R, G, B duty cycles. This can include two or more data points.

In block 208, $X_R$, $Y_R$, $Z_R$, and their biases (optionally) are determined by performing a linear regression. This can include computing $$X_R = \frac{N\Sigma(xy) - \Sigma x \Sigma y}{N\Sigma(x^2) - (\Sigma x)^2},$$

where x is the sensor reading of X (e.g., color component integer (counts)) at a R duty cycle of y (in percent) and N is the total number of measurements made. The bias includes $$X_{R\_b} = \frac{\Sigma y - X_R \Sigma x}{N},$$

where x is the sensor reading of X at a R duty cycle of y, N is the total number of measurements made, and $X_R$ is the value found in the last step. This is repeated for $Y_R$, $Y_{R\_b}$, $Z_R$, $Z_{R\_b}$. The bias measurements and vectors may be omitted in some embodiments. In other embodiments, a direct match may be employed between a reference and target without matrix computations, and instead doing an iterative comparison until updated duty cycles are determined.

The values of the second column of $P_R$ and $B_R$ (if used) are computed using the technique in block 208. This is repeated with R and G set to 0% and B varied to find the last column of the matrices $P_R$ and $B_R$.

Example: Setting B and G duty cycles to 0%, varying R duty cycle, and taking measurements on the reference panel:

| R duty cycle | X | Y | Z |
|---|---|---|---|
| 20.72 | 1023 | 601 | 11 |
| 40.33 | 1968 | 1150 | 19 |
| 60.29 | 2902 | 1687 | 27 |
| 80.27 | 3728 | 2183 | 36 |

Finding $X_R$:

$N = 4$ $\sum (xy) =$
$20.72*1023 + 40.33*1968 + 60.29*2902 + 80.27*3728 = 574774.14$ $\sum x = 20.72 + 40.33 + 60.29 + 80.27 = 201.61$ $\sum y = 1023 + 1968 + 2902 + 3728 = 9621$ $\sum x^2 = 20.72^2 + 40.33^2 + 60.29^2 + 80.27^2 = 12133.9843$ $X_R = \dfrac{N\sum(xy) - \sum x \sum y}{N\sum(x^2) - (\sum x)^2} = \dfrac{4*57477.14 - 201.61*9621}{4*12133.9843 - 201.61^2} = 45.556$ Finding $X_{R\_b}$:

$X_{R\_b} = \dfrac{\sum y - X_R \sum x}{N} = \dfrac{9621 - 45.556*201.61}{4} = 109.115$ Repeating this for $Y_R Y_{R\_b} Z_R Z_{R\_b}$:

$Y_R = 26.597,$ $Y_{R\_b} = 64.69,$ $Z_R = 0.418,$ $Z_{R\_b} = 2.185$

Using the values found, the first columns of $P_R$ and $B_R$ have been determined. The following are example measurements when varying the green and blue duty cycles. The resulting matrices become:

| G Duty cycle | X | Y | Z | B Duty Cycle | X | Y | Z |
|---|---|---|---|---|---|---|---|
| 20.75 | 363 | 1837 | 58 | 20.28 | 435 | 393 | 1312 |
| 40.3 | 701 | 3578 | 112 | 40.26 | 864 | 777 | 2622 |
| 60.27 | 1052 | 5361 | 166 | 60.25 | 1281 | 1156 | 3914 |
| 80.66 | 1406 | 7145 | 221 | 80.22 | 1701 | 1539 | 5212 |

$$P_R = \begin{bmatrix} 45.556 & 17.522 & 21.222 \\ 26.597 & 89.155 & 19.218 \\ 0.418 & 2.734 & 65.413 \end{bmatrix}$$

$$B_R = \begin{bmatrix} 109.115 & -2.666 & 0.632 \\ 64.69 & -13.395 & -2.388 \\ 2.185 & 1.45 & -31.956 \end{bmatrix}$$

In block 212, the bias vector $b_R$ can optionally be found from the bias matrix. The bias vector has the total bias for each of the X, Y, and Z readings. To find this, take a row sum of the bias matrix:

$$b_R = \begin{bmatrix} 109.115 - 2.666 + 0.632 \\ 64.69 - 13.395 - 2.388 \\ 2.185 + 1.45 - 31.956 \end{bmatrix} = \begin{bmatrix} 107.082 \\ 48.907 \\ -28.321 \end{bmatrix}$$

In block 214, the target matrices $P_T$, $B_T$ and $b_T$ are determined in a similar fashion. To find the matrices $P_T$ and $B_T$, follow the same steps employed as determining matrices $P_R$ and $B_R$ but with measurements from the target panel.

In blocks 216, 218, 220, 222 and 224, the steps above are repeated on a target panel to determine, $P_T$, $B_T$, and $b_T$ (optionally). After this, all the information needed to find the adjusted duty cycle for the target panel is available.

In block 226, a desired or target duty cycle is input (either from PWM input, from DMX data, measured data, etc. In block 228, correction is applied to compute or determine adjusted duty cycles for the target panel or panels. This can be performed by accounting for contributions of each color channel to the overall perceived color. For example, the value of $X_R$ in the $P_R$ matrix represents how the value of X changes per percentage change in the red duty cycle. This means that if $X_R$ is multiplied by the red duty cycle, we will find the expected X value on the reference panel if we were to measure it with the optical sensor. The green and blue portions of the LEDs also contribute to the X portion as well, so $X_G$ and $X_B$ need to be accounted for as well. This can be done in a matrix-vector multiplication:

$$P_R * d_R = \begin{bmatrix} \text{Expected } X \\ \text{Expected } Y \\ \text{Expected } Z \end{bmatrix}$$

Colors are adjusted. One goal could be to have the target panel's X, Y, and Z match that of the reference panel's, this relationship is as follows:

$$P_T * d_T = P_R * d_R$$

Solving this for the target duty cycle, we can find the adjusted duty cycle calculation for matching the expected X, Y, and Z values of the reference and target panel:

$$d_T = P_T^{-1}(P_R * d_R)$$

This formula does not account for the bias, and, in some embodiments, this may be sufficient to provide adequate matching. In block 230, bias in the target panel is optionally accounted for. The result of $P_R * d_R$ gives us the expected X, Y, and Z only based on the values found in $P_R$. The bias vector for the reference panel should be added to the result of $P_R * d_R$ to find the expected X, Y, and Z with the biases accounted for. The bias values of the target panel need to then be subtracted from this to so that $P_T^{-1}$ can convert the unbiased expected values to a target duty cycle. This results in: $d_T = P_T^{-1}(P_R * d_R + b_R - b_T)$.

Example: Find $P_T$ and $b_T$ for a target panel:

$$P_T = \begin{bmatrix} 47.852 & 18.772 & 19.961 \\ 28.568 & 85.961 & 18.762 \\ 0.539 & 2.198 & 61.334 \end{bmatrix}$$

$$b_T = \begin{bmatrix} 138.441 \\ 86.033 \\ -6.06 \end{bmatrix}$$

Using $P_T$, find $P_T^{-1}$:

$$P_T^{-1} = \begin{bmatrix} 0.024002 & -0.005082 & -0.006257 \\ -0.007993 & 0.013417 & -0.001503 \\ 0.000075 & -0.0004362 & 0.0164129 \end{bmatrix}$$

If a duty cycle of $d_R$ was applied to the reference panel, the duty cycle to apply to the target panel, $d_T$, can be found by:

$$d_T = \begin{bmatrix} 0.024002 & -0.005082 & -0.006257 \\ -0.007993 & 0.013417 & -0.001503 \\ 0.000075 & -0.0004362 & 0.0164129 \end{bmatrix} *$$

$$\left( \begin{bmatrix} 45.556 & 17.522 & 21.222 \\ 26.597 & 89.155 & 19.218 \\ 0.418 & 2.734 & 65.413 \end{bmatrix} * \begin{bmatrix} 70 \\ 22 \\ 44 \end{bmatrix} + \right.$$

$$\left. \begin{bmatrix} 107.082 \\ 48.907 \\ -28.321 \end{bmatrix} - \begin{bmatrix} 138.441 \\ 86.033 \\ -6.06 \end{bmatrix} \right) = \begin{bmatrix} 65.488 \\ 21.933 \\ 46.658 \end{bmatrix}$$

This reveals that if, e.g., a duty cycle of 70% red, 22% blue, and 44% green is applied to the reference panel, a duty cycle of 65.488% red, 21.933% blue, and 46.658% green should be applied to the target panel to have the colors match.

In block 232, the adjusted duty cycle $d_T$ is applied to the target panel to correct or match the perceived color of the reference panel. This can occur by altering the output of the PWM driver, directly outputting generated PWM cycles from a color corrector device, combinations thereof or using other PWM signal delivery methods. It should be understood that other computation methods can be employed to determine adjustments for pulse width in accordance with useful embodiments.

Figure 13:
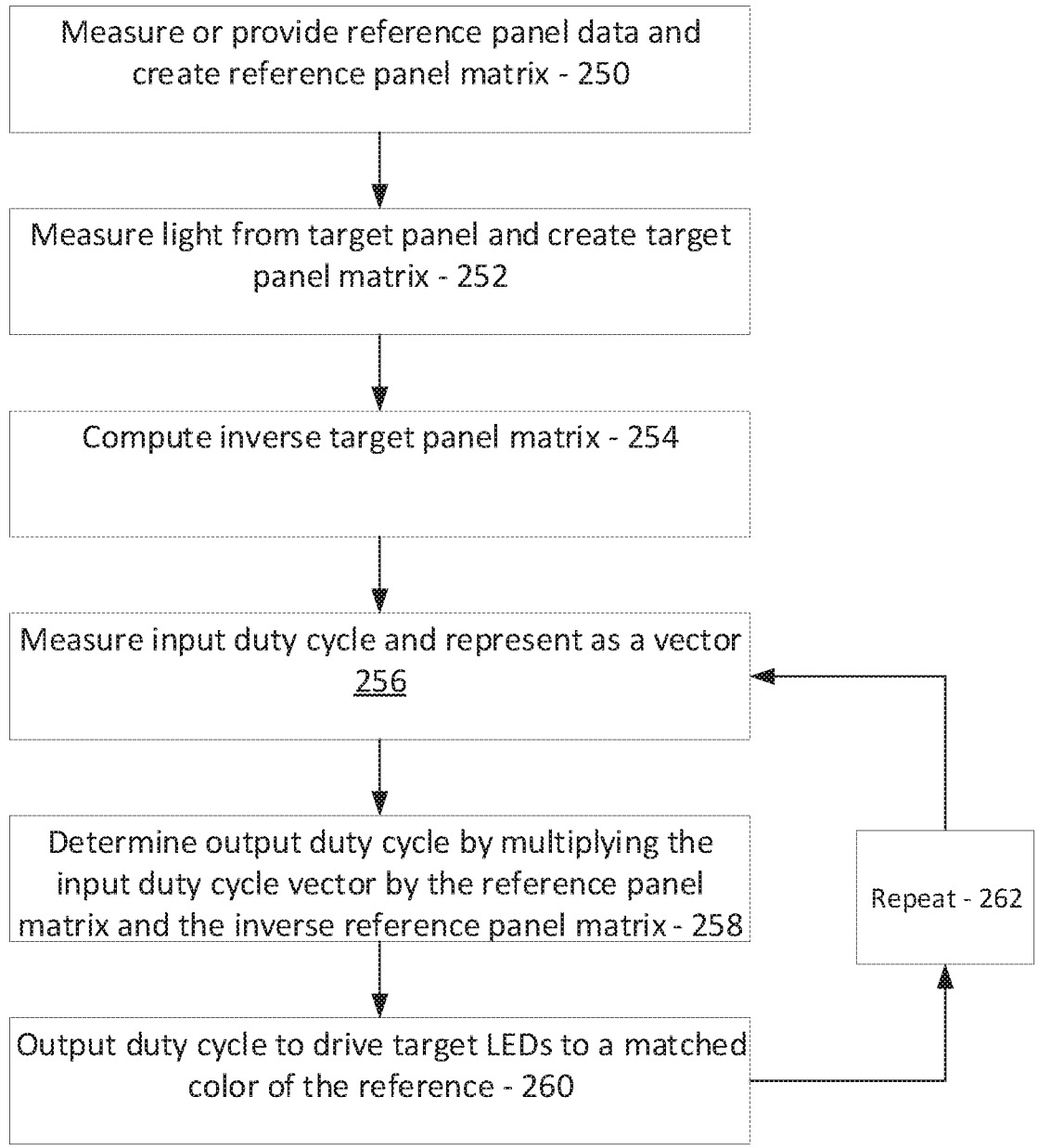
FIG. 13 is a flow diagram showing another method for computing adjusted pulse widths to color compensate lighting devices or fixtures in accordance with an embodiment of the present invention.

Referring to FIG. 13, in a particularly useful embodiment, in block 250, light is measured, determined or input (e.g., from an ideal panel) from a reference panel, and a reference panel matrix ($P_R$) is determined or computed. In block 252, light from a target panel is measured and a target panel matrix ($P_T$) (calibration step) is computed. In block 254, an inverse matrix ($P_T^{-1}$) of the target panel matrix is computed. Blocks 250, 252, and 254 can be considered calibration steps.

In block 256, input PWM duty cycle is measured and represented as a vector ($d_R$). In block 258, the input PWM vector ($d_R$) is multiplied by the reference panel matrix ($P_R$) and inverse target panel matrix ($P_T^{-1}$) to arrive at an output PWM vector ($d_T$). In block 260, an output PWM duty cycle is driven according to vector $d_T$.

In block 262, blocks 256, 258 and 260 can be repeated indefinitely for normal operation or as needed.

It should be understood that the circuits and magnitudes of components in the circuits are provided for illustrative purposes. These values can be adjusted as needed to achieve desired results. It should also be understood that other circuit components or schemes can be employed to maintain voltage drops across the string components.

Having described preferred embodiments for color correction devices, circuits, systems and methods (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A color correction device, comprising:
    a computation engine including a processor and a memory coupled to the processor, the computation engine being configured to receive reference color data;
    a non-transitory computer readable medium containing a software application configured to compute adjustment values needed to achieve the reference color data from a target color; and
    an output configured to output color corrected signals to light emitting diodes (LEDs) to achieve a reference color associated with the reference color data from the target color of the LEDs for color matching control between two or more LED arrays within an environment,
    wherein the computation engine predicts how much a duty cycle of each color is increased or decreased to achieve uniform color appearance between the two or more LED arrays.

2. The color correction device as recited in claim 1, wherein the computation engine performs linear algebra and matrix operations to predict how much the duty cycle of each color is increased or decreased to achieve the uniform color appearance between the two or more LED arrays.

3. The color correction device as recited in claim 1, wherein the computation engine computes panel vectors for a reference panel of LEDs that provides the reference color data and a target panel of LEDs and alters duty cycles of the target panel of LEDs to match the reference color of the reference panel.

4. The color correction device as recited in claim 1, wherein the computation engine computes panel vectors based on ideal panel data and a target panel of LEDs and alters duty cycles of the target panel of LEDs to match the ideal panel data.

5. The color correction device as recited in claim 1, wherein the computation engine computes panel vectors for a reference panel of LEDs and a target panel of LEDs based on measured panel data and alters the duty cycles of the target panel LEDs to match the reference color of the reference panel.

6. The color correction device as recited in claim 5, wherein the color correction device includes an optical sensor and the measured panel data is measured by the optical sensor.

7. The color correction device as recited in claim 1, wherein calibration data computed by the color correction device is stored on respective LED arrays of the two or more LED arrays.

8. The color correction device as recited in claim 1, wherein the color correction device controls a pulse width modulator for energizing the target LEDs.

9. The color correction device as recited in claim 1, wherein the color correction device functions as a pulse width modulator for energizing the target LEDs.

10. The color correction device as recited in claim 1, wherein the output includes transistors activated in accordance with at least one timer to alter duty cycles of target LEDs to achieve the reference color.

11. A color correction panel, comprising:
a target panel including a plurality of target light emitting diodes (LEDs);
a diffuser over the target LEDs to blend colors output from the target LEDs;
a color corrector device coupled to the target panel, the color corrector device including:
a computation engine including a processor and a memory coupled to the processor, the computation engine being configured to receive reference color data;
a non-transitory computer readable medium containing a software application configured to compute adjustment values needed to achieve the reference color data from a target color; and
an output configured to output color corrected signals to light emitting diodes (LEDs) to achieve a reference color associated with the reference color data from the target color of the LEDs for color matching control between two or more LED arrays within an environment,
wherein the computation engine predicts how much a duty cycle of each color is increased or decreased to achieve uniform color appearance between the two or more LED arrays.

12. The color correction panel as recited in claim 11, wherein the computation engine performs linear algebra and matrix operations to predict how much the duty cycle of each color is increased or decreased to achieve the uniform color appearance between the two or more LED arrays.

13. The color correction panel as recited in claim 11, wherein the computation engine computes panel vectors for a reference panel of LEDs that provides the reference color data alters duty cycles for the target panel of LEDs to match the reference color of the reference panel.

14. The color correction panel as recited in claim 11, wherein the computation engine computes panel vectors based on ideal panel data and alters duty cycles for the target LEDs to match the ideal panel data.

15. The color correction panel as recited in claim 11, wherein the computation engine computes panel vectors for a reference panel of LEDs and the target LEDs based on measured panel data and alters the duty cycles of the target LEDs to match the reference color of the reference panel.

16. The color correction panel as recited in claim 11, wherein the color correction device controls a pulse width modulator for energizing the target LEDs.

17. The color correction panel as recited in claim 11, wherein the color correction device functions as a pulse width modulator for energizing the target LEDs.

18. The color correction panel as recited in claim 11, wherein calibration data computed by the color correction device is stored on respective LED arrays of the two or more LED arrays.

19. The color correction panel as recited in claim 11, wherein the target panel can be decoupled from the color corrector device and data from the color corrected signals can be stored in memory on the target panel to be employed by the target panel to correct its color.

20. A method for color correction, comprising:
determining a reference panel matrix ($P_R$) based on colors of a reference panel;
determining a target panel matrix ($P_T$) based on light measured from a target panel;
calculating an inverse matrix ($P_T^{-1}$) for the target panel matrix;
representing input pulse width modulated (PWM) duty cycles as an input PWM vector ($d_R$);
determining an output PWM vector ($d_T$) by multiplying the input PWM vector ($d_R$) by the reference panel matrix ($P_R$) and the inverse matrix ($P_T^{-1}$) for the target panel matrix; and
driving an output PWM duty cycle of the target panel according to vector $d_T$ to achieve a color associated with the reference panel.

21. The method as recited in claim 20, wherein the reference panel is an ideal reference panel.

* * * * *